United States Patent [19]

Wu

[11] Patent Number: 5,897,348
[45] Date of Patent: Apr. 27, 1999

[54] LOW MASK COUNT SELF-ALIGNED SILICIDED CMOS TRANSISTORS WITH A HIGH ELECTROSTATIC DISCHARGE RESISTANCE

[75] Inventor: Shye-Lin Wu, Hsinchu, Taiwan

[73] Assignee: Texas Instruments - Acer Incorporated, Hsinchu, Taiwan

[21] Appl. No.: 09/042,351

[22] Filed: Mar. 13, 1998

[51] Int. Cl.$^6$ ............................................... H01L 21/8238
[52] U.S. Cl. ........................... 438/200; 438/229; 438/232
[58] Field of Search .................................... 438/200, 181, 438/184, 185, 199, 229, 230, 231, 232, 299, 301, 306, 514, 527, 546

[56] References Cited

U.S. PATENT DOCUMENTS

| 3,667,009 | 5/1972 | Rugg | 317/235 |
|---|---|---|---|
| 4,717,684 | 1/1988 | Katto et al. | 437/34 |
| 5,158,899 | 10/1992 | Yamagata | 437/27 |
| 5,262,344 | 11/1993 | Mistry | 437/57 |
| 5,366,908 | 11/1994 | Petella | 437/34 |
| 5,399,514 | 3/1995 | Ichikawa | 437/34 |
| 5,416,036 | 5/1995 | Hsue | 437/51 |
| 5,529,941 | 6/1996 | Huang | 437/44 |
| 5,532,178 | 7/1996 | Liaw et al. | 437/57 |
| 5,618,740 | 4/1997 | Huang | 438/224 |
| 5,620,920 | 4/1997 | Wilmsmeyer | 438/227 |
| 5,672,527 | 9/1997 | Lee | 437/41 |
| 5,698,457 | 12/1997 | Noguchi | 437/29 |
| 5,783,850 | 7/1998 | Liau et al. | 257/355 |

OTHER PUBLICATIONS

Yasuhiro Fukuda et al., ESD and Latch Up Phenomena on Advanced Technology LSI, EOS/ESD Symposium 1996, pp. 76–84, no month of publication.

Ajith Amerasekera et al., Correlating Drain Junction Scaling, Salicide Thickness, and Lateral NPN Behavior, with the ESD/EOS Perforance of a 0.25 μm CMOS Process, 1996 IEEE, pp. 893–896, no month of publication.

K. Fujii et al., A Thermally Stable Ti–W Salicide for Deep–Submicron Logic with Embedded DRAM, 1996 IEEE, pp. 451–454, no month of publication.

Primary Examiner—Jey Tsai
Assistant Examiner—Christopher Lattin
Attorney, Agent, or Firm—Harness, Dickey & Pierce, P.L.C.

[57] ABSTRACT

A method to fabricate simultaneously a CMOS transistor and an ESD protective transistor in a silicon substrate is disclosed. The NMOS transistor and PMOS transistor in the portion of the CMOS transistor have both anti-punchthrough and salicide structures and individually with n-LDD and p-LDD structure, respectively. The structure of ESD protective devices is fabricated with self-aligned silicide but without LDD, thus the degradation of ESD protection can be solved. The problems of accumulative aberration in scaled devices can also be alleviated through using blanket ion implantation technology and salicide process to reduce the mask count as shown in the invention.

17 Claims, 5 Drawing Sheets

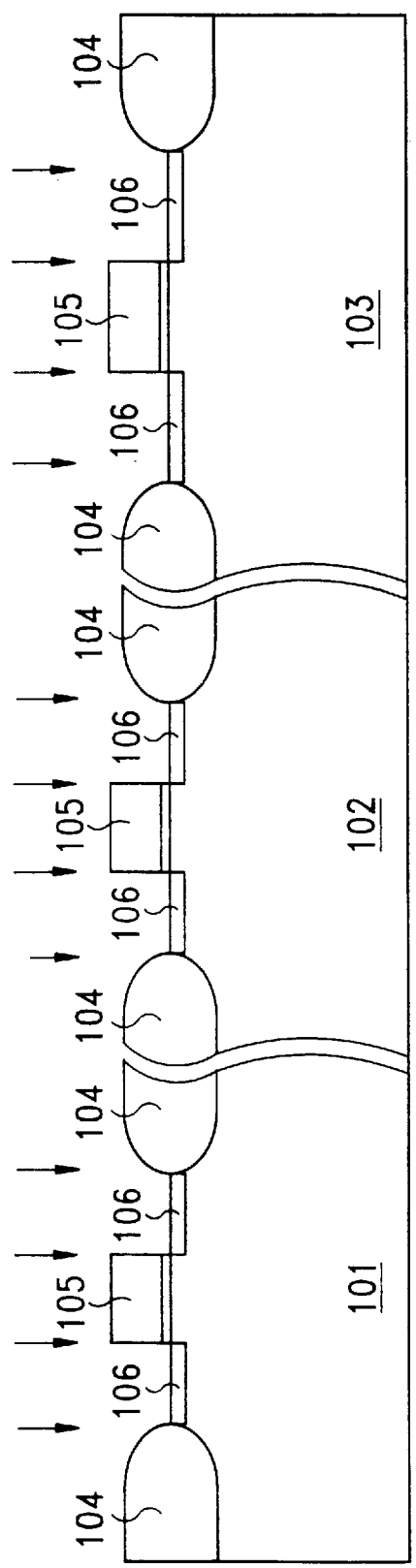
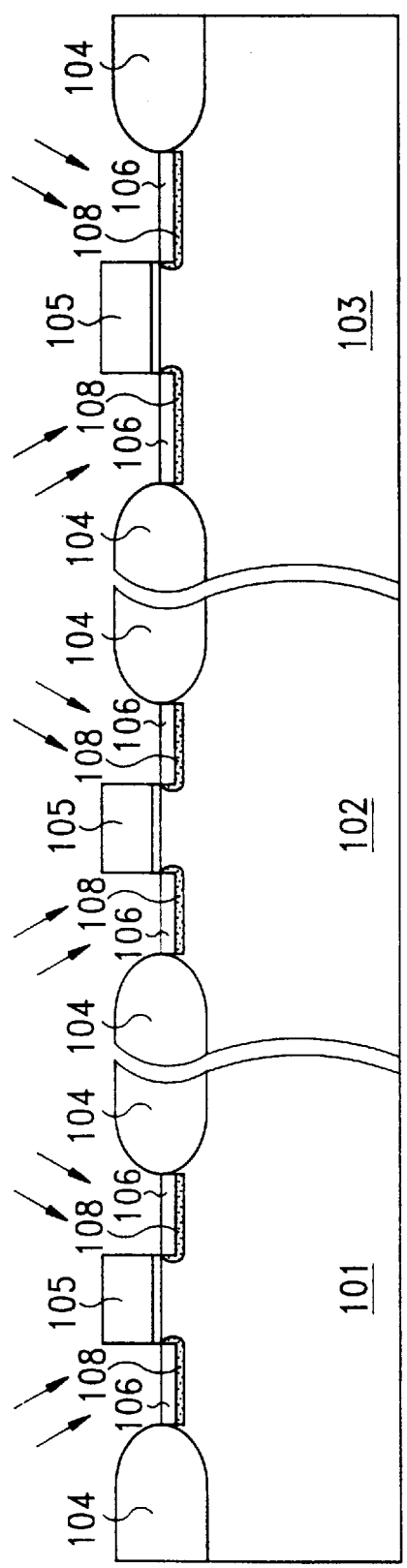
FIG. 1
FIG. 2

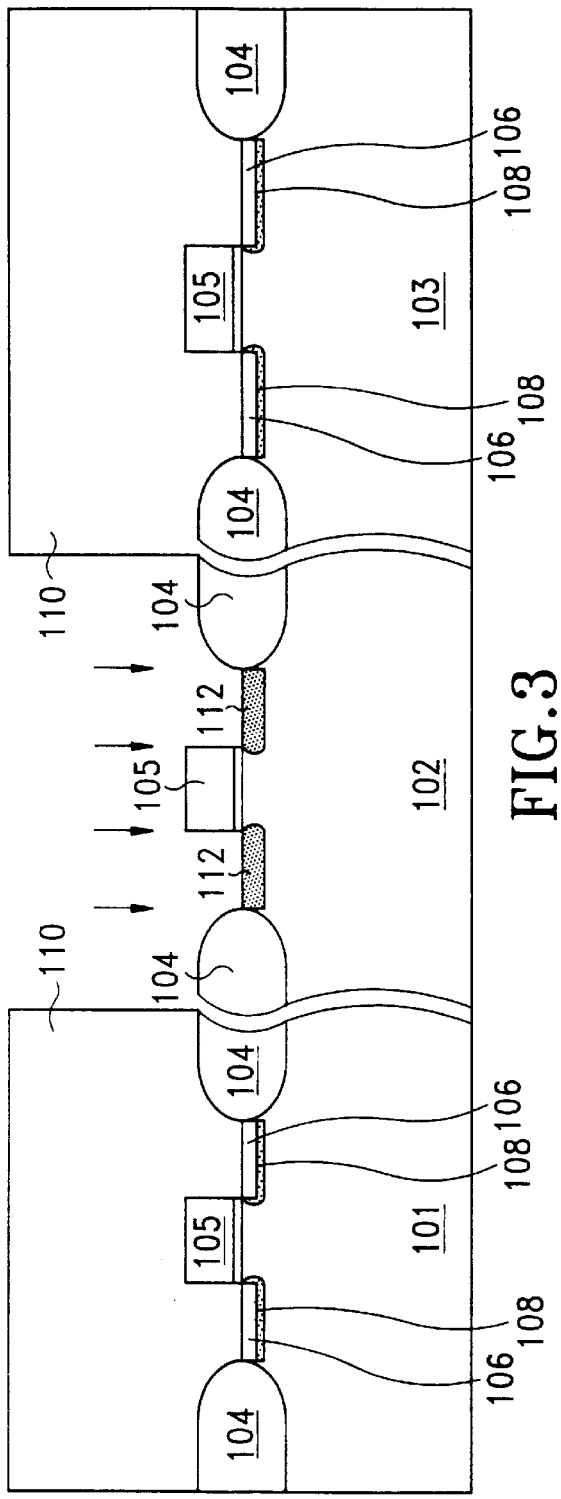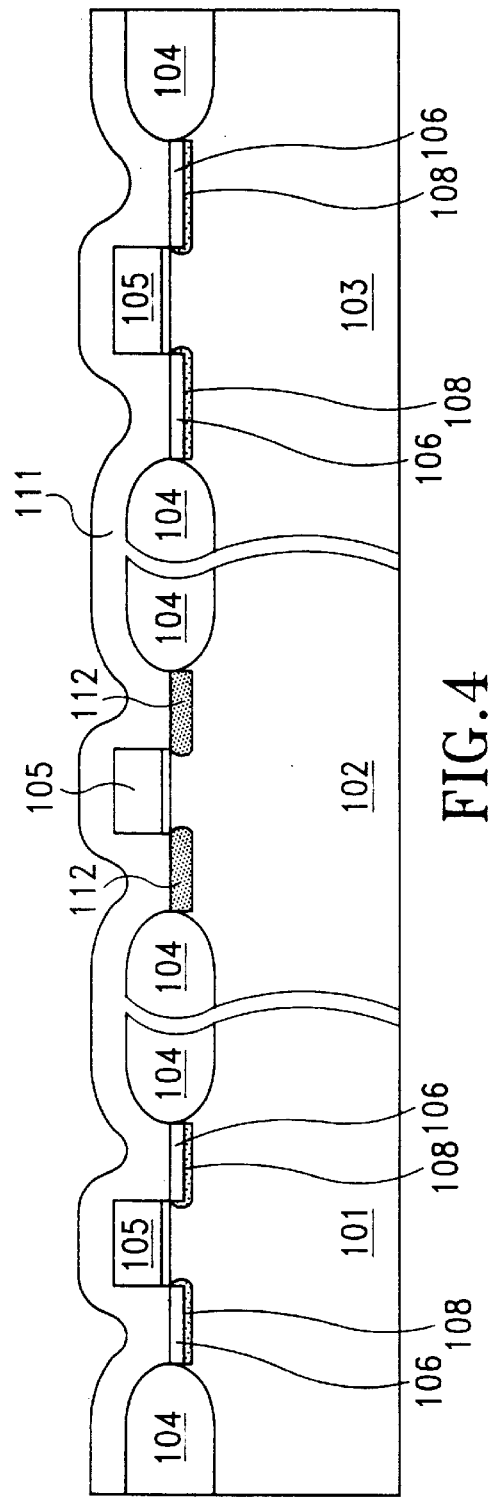

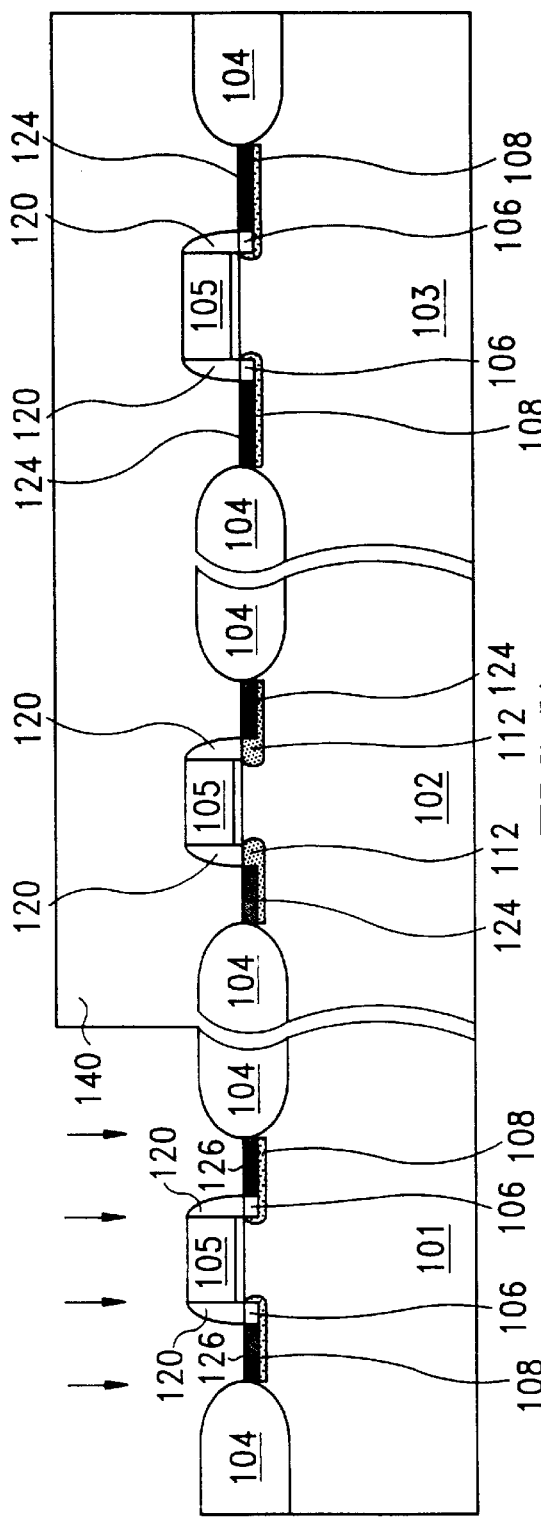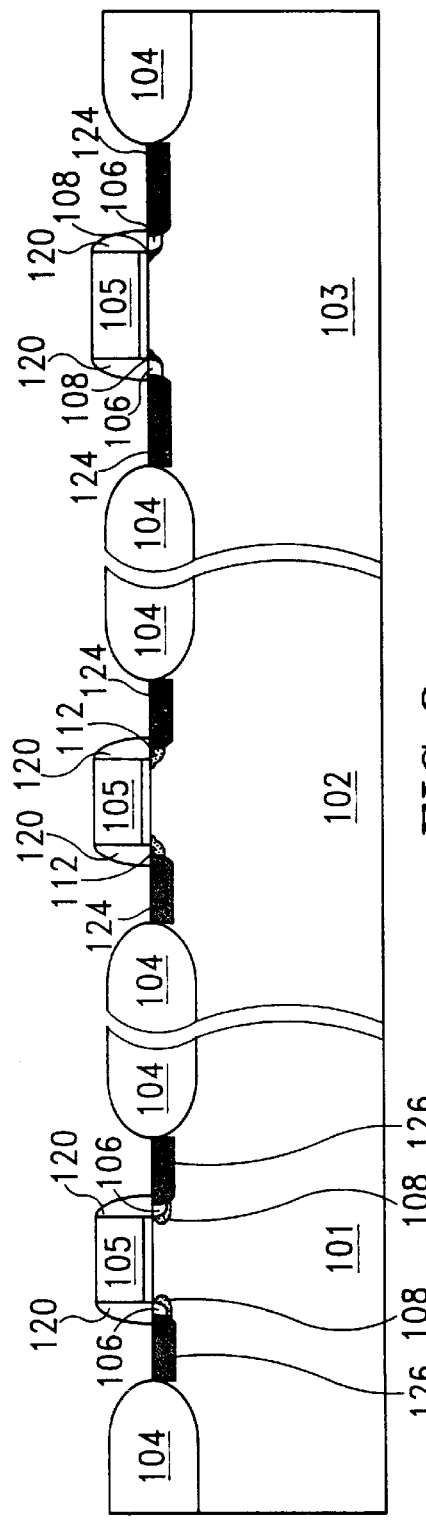

LOW MASK COUNT SELF-ALIGNED SILICIDED CMOS TRANSISTORS WITH A HIGH ELECTROSTATIC DISCHARGE RESISTANCE

FIELD OF THE INVENTION

The present invention relates to a semiconductor device process, and more specifically, to a method of fabricating low mask count self-aligned silicided CMOS transistors with a high ESD resistance.

BACKGROUND OF THE INVENTION

The trend in modern microelectronic devices is to minimize device dimension in order to reduce unit cost per function and to improve device performance. However, as a device scaled from one micron down to submicron or even down to deep-submicron scale, it may suffer more stringent problems. The problems, such as hot carrier effects and punchthrough effects are two of the major constraints in CMOS transistor scaling. Further, the accumulated aberration might occur after several lithography processes during fabrication of the scaled device structure. One strategy to avoid such issues is to reduce the mask count as much as possible.

Another critical issue accompanying with the feature size of MOSFET scale down and degrading significantly the device performance is the electrostatic discharge (ESD). The lightly doped drain (LDD) is commonly used to protect hot carrier induced degradation in MOS devices with gate length in submicron order. However, it is known to have poor ESD property for the transistors with LDD structure. The ESD is easily conducted through the input/output and power lead connections into the internal devices to destroy the devices. For example, as junction depth becomes shallower, the properties of integrated circuits are easily deteriorated by the human body. The high voltage can be accidentally applied to the pins of the IC package by a person while handling, causing the breakdown of the gate oxide of the devices. Thus, it is imperative that a built-in preventive ESD circuitry is formed simultaneously with the functional transistors. Fukuda, et al., in the reference "by Fukuda, et al., EOS/ESD Symp. p. 76 (1996)", give a comparison for the properties between an offset transistor and an LDD transistor, and showed that an offset transistor acts as an effective protection unit against soft-breakdown leakage generated by a human body event.

Several of new processes have thus been developed recently. For example, the self-aligned silicide formation is the one which has attracted much attention in recent years for its practical application, e.g. it provides not only low-sheet resistance for SID regions and for gate electrode in MOS devices but also a very clean silicide-silicon interface. Besides, it reduces at least one mask count and no additional etching step is required other than that of the conventional silicided formation method.

Unfortunately, the device with a self-aligned silicided contact shows a worse electrostatic discharge (ESD) performance than the non-silicided devices. Amerasekera et al. in IEDM Tech. Dig. p.893 (1996), investigated the junction depth and the salicide thickness in a 0.25 µm CMOS process affect the current gain $\beta$ of a self-biased lateral NPN (parasitic bipolar in aNMOS), and examined the relationship between $\beta$ and ESD performance, and proposed that the $\beta$ is observed to be strongly influenced by the effective drain/source diffusion depth below the salicide. The depth is determined by the implant energy as well as the amount of active diffusion consumed in silicidation. Thicker salicides are observed to reduce $\beta$. Further, the lower $\beta$ is found to have lower ESD performance. Thus, one of the methodologies to solve the problems caused by the salicidation and the LDD is increasing the junction depth and removes the LDD structure in the ESD protective device when the ESD preventive circuitry and the ULSI devices with a salicidation are fabricated at the same time.

U.S. Pat. No. 4,717,684 to Katto et al., issued January 1988, describes a conventional method to fabricate an ESD circuit during the salicided process. As aforementioned, an ESD device is required to remove the LDD structure; thus, the process required several masks while forming the ESD protection devices and the MOSFET simultaneously. A modified process to reduce mask count was described in U.S. Pat. No. 5,672,527 to J. S. Lee, issued Sep. 1997. Lee proposed a new method to fabricate the ESD protection circuit and MOSFET at the same time. The features that Lee proposed are only one photo mask to form ESD protective circuits without the salicide and the LDD structure. However, the metal layer on the source/drain region of the ESD protection device is needs to be selectively etched before succeeding the silicides process as in his mentioned method. It is worth noting that it would be rather difficult to remove the metal layer on distinct material (e.g. silicon, oxide spacer, poly-silicon and isolation layer) without damaging the underlay substrate, and thus a complicated etching process is required.

SUMMARY OF THE INVENTION

In the present invention a method to simultaneously fabricate a CMOS transistor and an ESD protective transistor in a silicon substrate is disclosed where each device has a defined source, drain, gate structure and is separated by an isolation region. The method comprises the steps of: performing a low dose $BF_2^+$ blanked implant to form p-LDD regions, then a low dose n-type large-angle tilted implant is succeeded to form anti-punchthrough regions on each transistor. After that, a photoresist is masked on the PMOS device and the ESD protective region at the same time, as well as the exposed NMOS device region by using a lithography technology. Next, a low dose ion implantation by phosphorus ions is performed to form n-LDD in the NMOS device region. It is noted that for compensating the p-LDD formed in the NMOS device region, the dosage of phosphorus ions for n-LDD is larger than that of $BF_2^+$ ions for p-LDD. After removing the mask, a CVD oxide layer is deposited on all top surfaces, and is then etched back from the oxide layer to form oxide spacers. Masking the PMOS device, a $n^+$ source, drain ion implantation by using high dose arsenic ions is then implanted. For forming $p^+$ source/drain, the photoresist on the PMOS device is stripped, and the other photoresist is masked on all regions except the PMOS region. A high dose $BF_2^+$ ion implantation is carried out. Stripping all masks on the substrate then a high temperature thermal annealing is then done to activate the dopant impurities and to form a shallow junction at the same time. After that, a sputtering or a CVD method is utilized to deposit a refractory or a noble metal layer on all surfaces of the substrate. The first step of thermal annealing is used to form a self-aligned silicided contact on the source/drain regions and polycided layer on the surface of poly-Si gate of substrate. After removing the unreacted metal layer, a second thermal process is performed to form a low resistance and a stable silicide phase.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a p-LDD implanted into a silicon substrate with a defined gate structure in the PMOS and the NMOS devices and the ESD protective device according to the prior art;

FIG. 2 is a cross-sectional view of a large tiled angle anti-punchthrough implanted into a silicon substrate according to the present invention;

FIG. 3 is a cross-sectional view of performing a n-LDD implantation in the NMOS device according to the present invention;

FIG. 4 is a cross-sectional view of forming a CVD oxide layer on all areas;

FIG. 7 is a cross-sectional view of performing $p^+$ S/D ion implantation in a PMOS device according to the present invention;

FIG. 8 is a cross-sectional view of a metal layer on all upper surfaces of the substrate by using a sputtering deposition or a CVD method;

DETAILED DESCRIPTION OF THE PREFERRED EMBODIMENT

Figure 5:
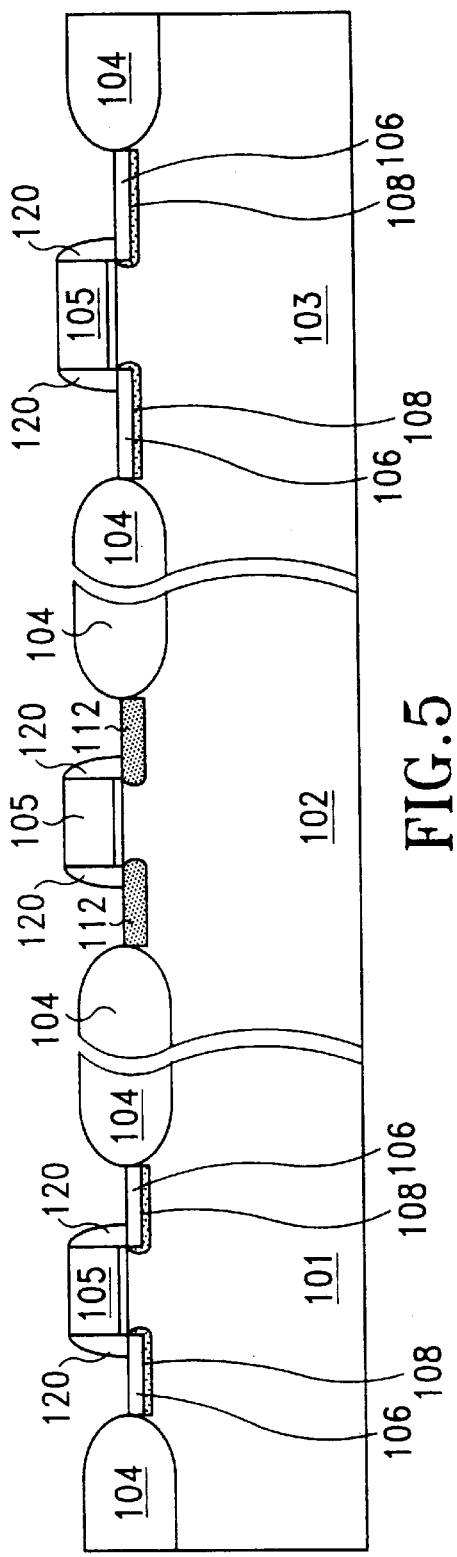
FIG. 5 is a cross-sectional view of etching back the CVD an oxide to form oxide spacer according to the present invention.

The issues that the salicided process and the LDD structure can degrade the ESD performance are required to be solved as aforementioned. Besides, how to simplify the processes rather than complicate the etching steps during salicided process is essential too. A method by which low mask count self-aligned silicided CMOS transistors are formed simultaneously with an offset and a high resistance ESD protection structure is provided in the present invention. The detailed processes will be described as follows.

FIG. 1 shows a cross-sectional view of regions on a <001>orientation silicon substrate for forming a PMOS 101, a NMOS 102 transistor, and an ESD protection device 103. Each device with a defined poly-Si /oxide gate 103 is spaced by an isolation region 104. The method for patterning the poly-silicon gate structure 103 and forming isolation regions 104 is known in the art, therefore, no details are given. A p-type LDD technology is then implanted (indicated by arrows) into all areas to form p-LDD regions 106. In a preferred embodiment, the p-type LDD forming the p- region 106 is carried out by using $BF_2^+$ ions with a low energy of about 5–100 keV and a dosage of about $5 \times 10^{11}/cm^2$ to $5 \times 10^{13}/cm^2$. This step could improve the current driving ability of the PMOS transistor for the low temperature processing condition.

FIG. 2 shows lower dose, n-type ions and large-angle titled (the directions as indicated by arrows) ion implantation, which is blanket performed in all areas to form p- channel anti-punchthrough regions 108. In a preferred embodiment, the n-type ions are phosphorus ions with an energy and a dosage of about 20–120 keV and $10^{12}$–$5 \times 10^{13}/cm^2$, respectively, by using an angle of about 10–60°.

Referring to FIG. 3, a first photoresist 1 10 is masked via a lithography process on the defining ESD protective device 103 and the PMOS device regions 101. Thereafter, a lightly doped drain implantation (indicated by arrows) is achieved to form n- regions 112 in the unmasked region, NMOS device 102. The energy and the dosage for phosphorus ion implantation are about 5 keV to 120 keV, and $5 \times 10^{12}/cm^2$ to $10^{14}/cm^2$, respectively. It is noted that for compensating the p-LDD in the NMOS device, the dosage of phosphorus being used in this process has to be higher than that of p-region 106 formed previously.

The next step is stripping the photoresist 110 on the PMOS 101 and the ESD protective device regions 103. A chemical vapor deposition (CVD) method is done to deposit a dielectric layer 111 on all regions as shown in FIG. 4.

Referring to FIG. 5, an anisotropic dry etching is applied to etch the dielectric layer 111 to form the gate sidewall spacer 120. In general, the CVD method used to form the spacer is achieved by using LPCVD TEOS (tetraethyl orthosilicate, $Si(OC_2H_5)_4$). The film formed by this method has properties of excellent uniformity and step coverage. By decomposing the vaporized liquid TEOS, silicon dioxide in a low-pressure CVD (LPCVD) is reactored at temperature of about 650 to 750° C. The reaction is written as:

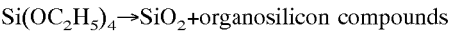

$Si(OC_2H_5)_4 \rightarrow SiO_2$+organosilicon compounds

Figure 6:
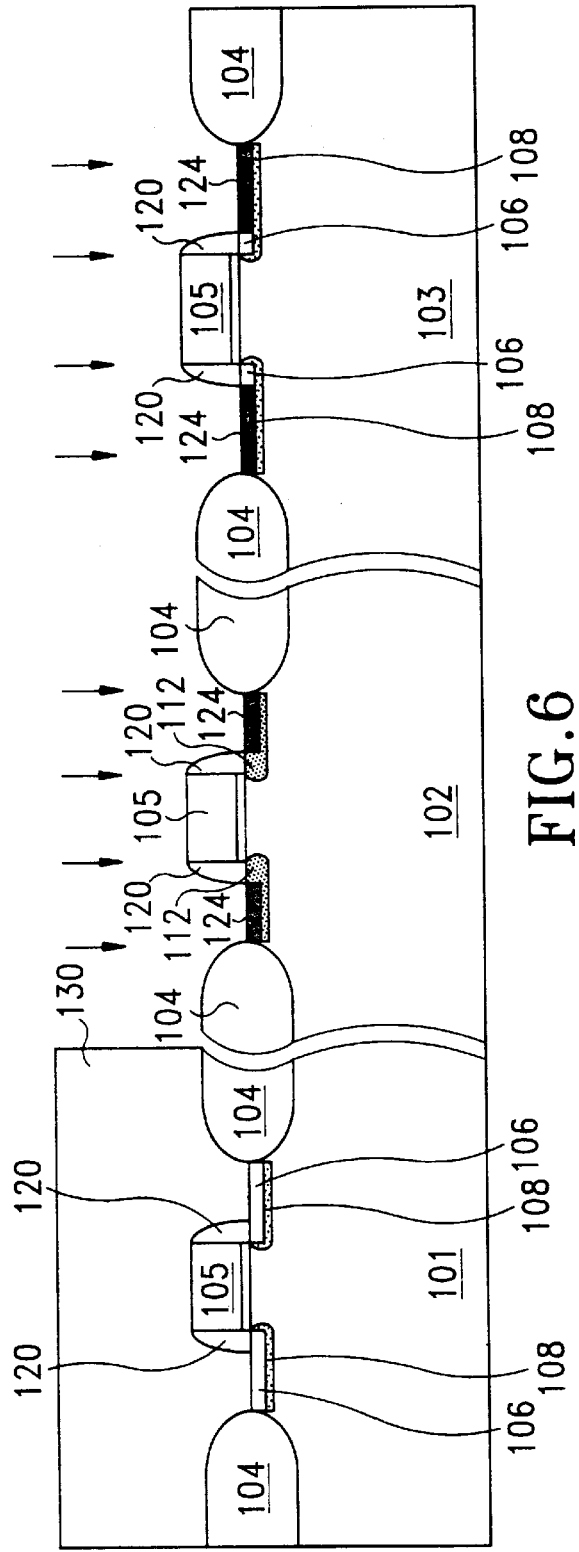
FIG. 6 is a cross-sectional view of performing $n^+$ S/D ion implantation in NMOS devices and ESD protective device, according to the present invention.

FIG. 6 shows a second photoresist 130 masked on the PMOS device region 101. In order to form source/drain (S/D) junctions, high dose, low energy n-type ions are implanted (indicated by arrows) into unmasked regions. As a result, the $n^+$ S/D regions 124 are formed both in the portion of n- regions 112 of NMOS device region 102 and in the portion 108 of the ESD protective region 103. The dose and energy used in a preferred embodiment are about 0.5–100 keV and $5 \times 10^{14}$–$5 \times 10^{16}/cm^2$, respectively.

For the purpose of forming the $p^+$ S/D region 126, the photoresist 130 on the PMOS device region 101 is first stripped then the other photoresist 140 is masked on both the NMOS device region 102 and the ESD device region 103. The $BF_2^+$ ions are then implanted into (indicated by arrows) the PMOS device region 101 with an energy of about 0.5–100 keV and a dosage of about $5 \times 10^{14}$–$5 \times 10^{16}/cm^2$. The resulting are drawn in the FIG. 7.

Turning to remove the photoresist 140 as shown in FIG. 8, a high temperature annealing process is applied to activate the dopants. The dopant impurities in the p- regions are diffused and redistributed while the annealing process is done, and shallow junctions are formed at the same time. For examples, the p-type impurities in the S/D region 126 of the PMOS device 101 had driven in the p- LDD 106. In addition, the n-type impurities in S/D region 124 of the NMOS device 102 as well as the ESD protective device 103 also, respectively, are diffused to overlap the n-LDD region 112 and p-LDD region 106. It is noted that the p- channel anti-punchthrough region 108 is extended into the region below the gate structure too, as shown in this figure. In a preferred embodiment, the annealing process can be conducted in a conventional furnace and annealed at a temperature of about 750–1100° C. for 5 to 180 min.

Figure 9:
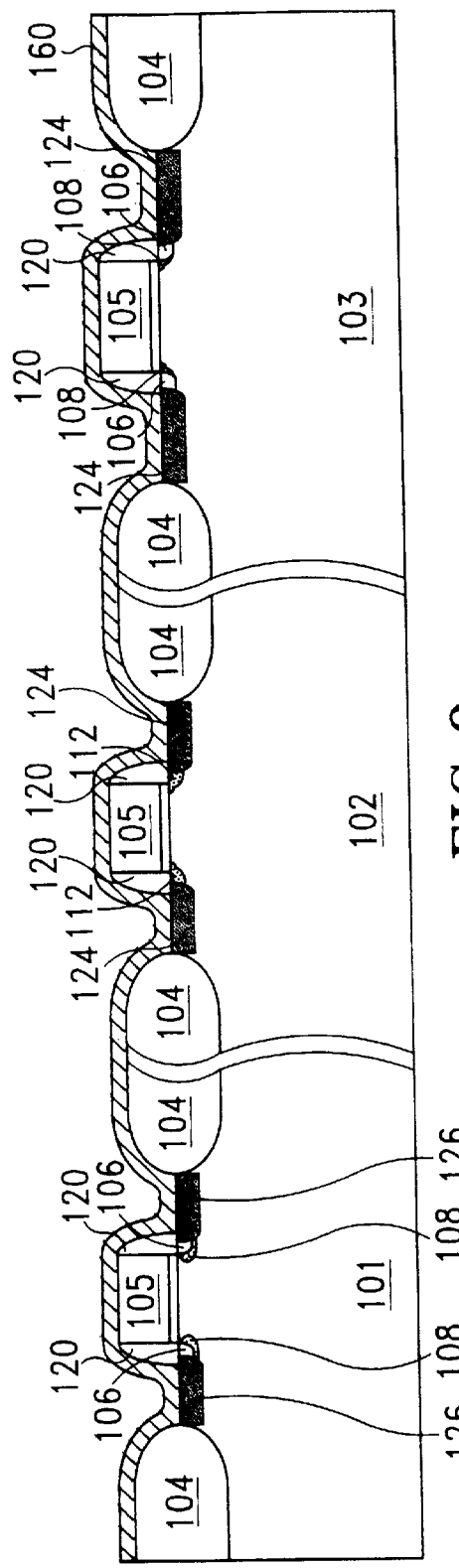
FIG. 9 is a cross-sectional view of a result of doping redistribution after a high temperature thermal annealing according to the present invention.

Referring to FIG. 9, a refractory, or a noble metal 125 is blanket deposited on all areas and generally with 10 nm to 100 nm in thickness,The deposited method can be done by a CVD or by a sputtering technology. Preferably, the metal is selected from the group consists of Ti, W, Co, Ni and Pt or a combination thereof.

Figure 10:
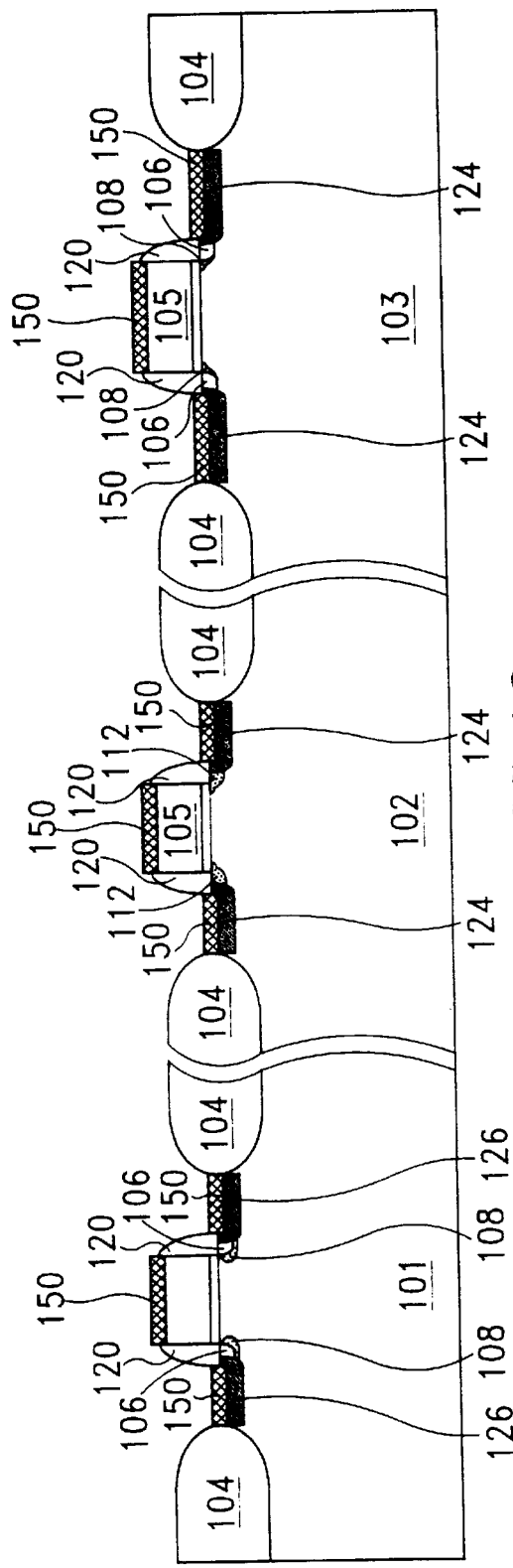
FIG. 10 is a cross-sectional view of a result of forming self-aligned silicided contacts after a metal layer is deposited and two step annealing are followed according to the present invention.

Two-step annealing is subsequently achieved to form the self-aligned silicided contacts. A first-step rapid thermal process (RTP) is done at a temperature of about 300° C. to 700° C. in nitrogen ambience. The metal layer 160 reacts with the poly-Si on the gate structure 105, and then a self-aligned gate silicide layer 150 is formed on the top surface of the poly-gate 105. At the same time, a silicide layer 150 is also formed on the source/drain regions 106 by consuming a layer of silicon substrate. FIG. 10 shows that results of some of the unreacted metal layers (on the isolation region and on the spacer) are selectively removed through using an etchant that does not attack the silicide, the silicon substrate, or the $SiO_2$. Preferably, the removal of the unreacted metal layer can be done by a wet etchant containing $NH_4OH$, $H_2O$, and $H_2O_2$.

Next a second-step thermal process in a furnace at a high temperature of about 750° C. to 1050° C. for 5 min to 60 min or by utilizing a rapid thermal process at 750° C. to 1050° C. for 5 s to 180 s is implemented. The silicide formed at first-step annealing will transform to a lower sheet resistance and a stable silicide phase.

It is noted that in particular, for deep-submicron logic ULSIs, a refractory alloy prevails, for example, Ti-5at %W is more preferable than Ti as suggested by Fujii et al., in the reference, K. Fujii, et al., IEDM Tech. Dig. p.893 (1996), since in conventional Ti silicide processes the sheet resistance of TiSi2 increases with decreasing the film thickness and with narrowing the line width. However, the Ti-5at %W silicide keeps the C49 phase below 900° C. annealing on both 0.18 μm gate and 0.35 μm diffusion layer but the surface of Ti-5at %W silicide is smoother than that of TiSi2, and the resistiveness of silicide film depends on neither the line width nor the film thickness.

The benefits of this invention are:

(1) the circuit operation speed could be significantly improved due to the functional CMOS transistors having a self-aligned silicided contact;

(2) the offset MOSFET structure as shown in FIG. 8, thus the high ESD protective voltage could be obtained (see the reference Y. Fukuda, et al., in EOS/ESD Symp. p.76 (1996); and (3) at least one mask could be saved, compared with the aforementioned prior art, to form a high performance PMOS device, NMOS device and ESD protective circuit.

As is understood by a person skilled in the art, the foregoing preferred embodiment of the present invention is an illustration of the present invention rather than limitation thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, in the method we propose that for fabricating self-aligned CMOS transistor with a high ESD resistance the p-channel anti-punchthrough regions could also be formed prior to form p-LDD regions as shown in FIG. 1 and FIG. 2. In addition, the sequence for forming the $n^+$ S/D region and $p^+$ S/D region can also be exchanged without giving any influence to the structure of devices as shown in FIG. 6 and FIG. 7.

What is claimed is:

1. A method for simultaneously fabricating a PMOS transistor, a NMOS transistor and an ESD protective transistor on a silicon substrate such that each transistor is spaced by an isolated region and has a defined gate structure, said method comprising the steps of:

performing a first stage of ion implantation, wherein a species of p-type ion is implanted into said silicon substrate to form p-region in said PMOS, said NMOS and said ESD protection region so that a p-LDD is formed in said PMOS transistor;

performing a second stage of ion implantation, wherein a species of n-type ions with an angle is implanted into said silicon substrate so that an anti-punchthrough region is formed in said substrate;

forming a first mask on said PMOS transistor and on said ESD protective transistor;

performing a third stage of ion implantation, a species of n-type ions is implanted into said NMOS transistor of silicon substrate to form a n- region so that a n-LDD structure is formed in said NMOS transistor;

removing said first mask of said PMOS transistor and said ESD protective transistor;

forming an insulating layer on all exposed surfaces of said substrate;

etching back said insulating layer on all exposed surfaces of said substrate to form a spacer on sidewalls of said gate structure;

forming a second mask on said PMOS transistor of said substrate;

performing a fourth stage of ion implantation, wherein a species of n-type ions is implanted into said NMOS transistor and said ESD protective transistor of silicon substrate to form a plurality of source/drain regions;

removing said second mask of said PMOS transistor of said substrate;

forming a third mask on said NMOS transistor and said ESD protective transistor;

performing a fifth stage of ion implantation, a species of p-type ions is implanted into said PMOS transistor of said substrate to form a plurality of source/drain regions;

removing said third mask of said NMOS transistor and said ESD protective transistor;

thermally annealing said substrate;

forming a metal layer on all surfaces of said substrate;

performing a first stage of silicided thermal annealing of said substrate to form a silicided layer on said source/drain and said gate structure of said PMOS transistor, said NMOS transistor and said ESD protective transistor on said silicon substrate;

etching all unreacted metal of said spacers and isolation region of said substrate;

performing a second stage of silicided thermal annealing of said substrate to form a stable phase and low resistance of silicided layer on said source/drain and said gate structure of said PMOS transistor, said NMOS transistor and said ESD protective transistor of said silicon substrate.

2. The method of claim 1, wherein said first stage of ion implantation is implanted by using said p-type ions with an energy and a dosage of about 5–10 keV and of about $5 \times 10^{11}$–$5 \times 10^{13}$/cm$^2$, respectively.

3. The method of claim 2, wherein said p-type ions are selected from a group consisting of boron and $BF_2^+$ ions.

4. The method of claim 1, wherein said second stage of ion implantation is implanted by using said n-type ions with an energy of about 20–120 keV and a dose of about $1\times10^{12}$–$5\times10^{13}$/cm².

5. The method of claim 4, wherein said n-type ions are selected from a group consisting of phosphorus and arsenic ions.

6. The method of claim 1, wherein said third stage of ion implantation is implanted by using said n-type ions with an energy of about 5–120 keV and a dose of about $5\times10^{12}$–$1\times10^{14}$/cm².

7. The method of claim 1, wherein said fourth stage of ion implantation is implanted by using said n-type ions with an energy and a dosage of about 0.5–100 keV and of about $5\times10^{14}$–$5\times10^{16}$/cm², respectively.

8. The method of claim 7, wherein said species of n-type ions is selected from a group consisting of arsenic, antimony and phosphorus.

9. The method of claim 1, wherein said insulating layer for forming spacers on sidewalls of said gate structure is using a CVD method at a temperature of about 600–800° C.

10. The method of claim 1, wherein said fifth stage of ion implantation is implanted by using said p-type ions with an energy and a dosage of about 0.5–100 keV and of about $5\times10^{14}$–$5\times10^{16}$/cm², respectively.

11. The method of claim 10, wherein said species of p-type ions is selected from a group consisting of boron and $BF_2^+$ ions.

12. The method of claim 1, wherein said thermal annealing is conducted at a temperature of about 750–1100° C.

13. The method of claim 1, wherein said metal layer is formed by a method selected from a group consisting of sputtering and CVD, with a temperature of about 25–500° C. and with a thickness of about 10–100 nm.

14. The method of claim 1, wherein said metal layer is selected from a group consisting of Ti, Co, W, Pt, Ni and a combination thereof.

15. The method of claim 1, wherein said first stage of silicided thermal annealing is carried out at a temperature of about 300–700° C.

16. The method of claim 1, wherein said second stage of said silicided thermal annealing is carried out in a furnace at a temperature of about 750–1050° C.

17. The method of claim 1, wherein said second stage of said silicided thermal annealing is carried out in rapid thermal process at a temperature of about 750–1050° C.

* * * * *